United States Patent
Blanding et al.

(10) Patent No.: US 7,800,852 B2
(45) Date of Patent: Sep. 21, 2010

(54) KINEMATIC OPTICAL MOUNT

(75) Inventors: Douglass L Blanding, Painted Post, NY (US); John H Bruning, Pittsford, NY (US); Jack W Frankovich, Fairport, NY (US); Keith E Hanford, Macedon, NY (US); Kevin J Magierski, Victor, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/390,591

(22) Filed: Feb. 23, 2009

(65) Prior Publication Data

US 2009/0219634 A1 Sep. 3, 2009

Related U.S. Application Data

(60) Provisional application No. 61/067,791, filed on Feb. 29, 2008.

(51) Int. Cl.
*G02B 7/02* (2006.01)
(52) U.S. Cl. ........................ 359/823; 359/811
(58) Field of Classification Search ......... 359/811–827, 359/876, 873
See application file for complete search history.

(56) References Cited

U.S. PATENT DOCUMENTS

| 5,249,197 | A | 9/1993 | Kittell | 372/107 |
|---|---|---|---|---|
| 5,270,870 | A | 12/1993 | O'Brien et al. | 359/820 |
| 5,420,240 | A | 5/1995 | Kuramoto et al. | 528/488 |
| 5,986,827 | A * | 11/1999 | Hale | 359/822 |
| 6,191,898 | B1 * | 2/2001 | Trunz et al. | 359/819 |
| 6,271,976 | B1 * | 8/2001 | Weber | 359/819 |
| 6,400,516 | B1 * | 6/2002 | Spinali | 359/819 |
| 6,538,829 | B2 | 3/2003 | Rau et al. | 359/819 |
| 6,873,478 | B2 | 3/2005 | Watson | 359/819 |
| 6,922,293 | B2 * | 7/2005 | Watson et al. | 359/819 |
| 7,170,589 | B2 | 1/2007 | Cherala et al. | 355/72 |
| 2004/0189969 | A1 | 9/2004 | Mizuno | 355/67 |
| 2006/0001886 | A1 | 1/2006 | Zacharie et al. | 359/486 |
| 2007/0251825 | A1 | 11/2007 | Kenney | 205/67 |

OTHER PUBLICATIONS

Blanding, Douglass L.; "Exact Constraint: Machine Design Using Kinematic Principles", ASME Press, New York, 1999; pp. 93-98, January.

* cited by examiner

*Primary Examiner*—Mohammed Hasan
(74) *Attorney, Agent, or Firm*—Timothy M Schaeberle

(57) ABSTRACT

A positioning apparatus for providing relative movement between a first member and a second member has a lever element pivotably coupled to the first member along a fulcrum member and has an actuator arm and a positioner arm. First and second flexure elements extend between the positioner arm of the lever element and the second member. An actuator is coupled to the actuator arm of the lever element.

20 Claims, 8 Drawing Sheets

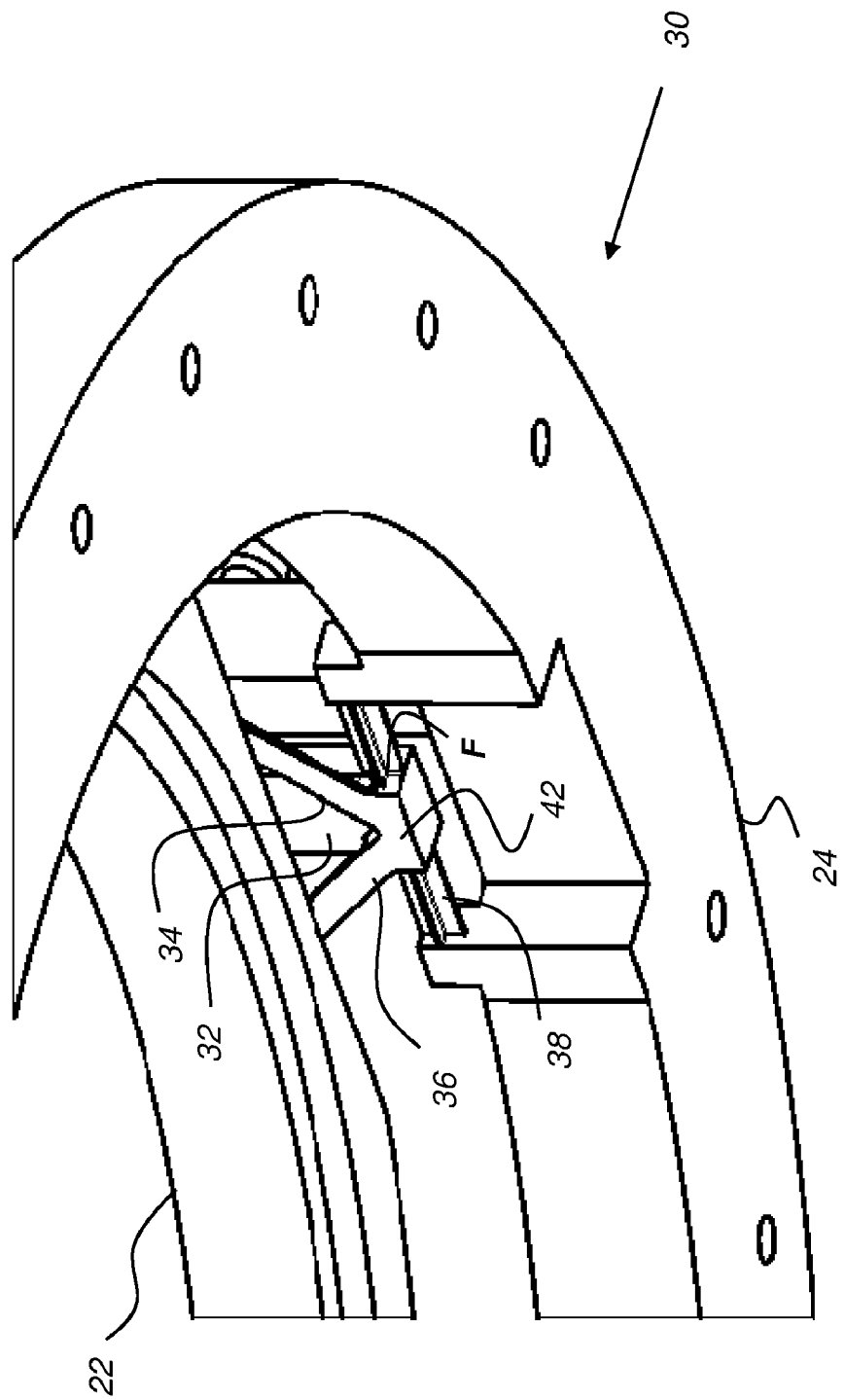

KINEMATIC OPTICAL MOUNT

CROSS-REFERENCE TO RELATED APPLICATIONS

This application claims the benefit of priority under 35 U.S.C. §119(e) of U.S. Provisional Application Ser. No. 61/067,791 filed on Feb. 29, 2008.

FIELD

This invention generally relates to component mounting and more particularly relates to a mount for an optical element that allows positioning along an optical axis, but constrains rotational movement along any axis and constrains translational movement in directions orthogonal to the optical axis.

BACKGROUND

Photolithography or microlithography apparatus are widely used in the fabrication of microelectronic semiconductor devices and other microdevices. In photolithography, an optical system directs light energy to record a pattern at high resolution and with precise registration onto a photosensitive layer formed on a silicon wafer or other substrate. Continuing improvements in miniaturization place increasingly more challenging demands on the performance and accuracy of the optical system used for this function.

Microlithography optical systems are fairly large and complex, containing a number of optical elements. In a typical "stepper lens" arrangement used for microlithography, stacked annuli lens assembly is used, as described, for example, in U.S. Pat. No. 5,428,482 entitled "Decoupled Mount for Optical Element and Stacked Annuli Assembly" to Bruning et al. Each lens element is accurately mounted within a cylindrically shaped cell, typically of stainless steel. Each cell is fabricated to extremely tight tolerances, with faces ground flat and parallel. When the lens is assembled, each successive cell is bolted to the face of its adjacent cell with no adjustment possible other than a small centering motion in X and Y. Once all the cells have been assembled, the entire lens is tested and any unwanted aberrations or image defects are discovered. Commonly, a lens can be completely assembled before it is determined that one or more of the elements may need to be moved slightly in the Z or axial direction in order to correct a measured optical defect. To accomplish this, the lens must be disassembled and new spacers inserted, whereupon the lens is reassembled, carefully making all the centering adjustments again.

Achieving correct magnification and focus are critical for obtaining precise layer-to-layer registration and submicron resolution with photolithographic optics used for device fabrication. Focus adjustment is usually enabled by displacement of an optical element along the optical axis, conventionally the z-axis, with no translation in the orthogonal x or y axes. For example, in order to properly adjust magnification or focus, it is often necessary to move specific components of the optical system to specific positions along the optical axis. In obtaining this movement, it is important to minimize or eliminate inadvertent movement of other components of the optical system.

Where lens axial adjustment may be necessary in a stacked annuli arrangement, solutions that take advantage of balanced or kinematic constraining forces, using springs and flexures for example, can be more promising for high precision adjustment applications than are static solutions. However, proposed solutions of this type for providing pure axial translation adjustment are typically highly complex, often requiring precision fabrication and assembly of multiple interconnecting parts. As just one example, in the embodiment described in U.S. Pat. No. 6,538,829 entitled "Optical Element Mount Comprising an Optical Element Holding Frame" to Rau et al., an optical mount for adjusting two components relative to each other is shown. The mechanism described in the '829 Rau et al. disclosure employs a fairly complex network of flexures and hinges for providing this type of axial translation adjustment.

With any type of solution for axial adjustment, even the slightest parasitic effects or asymmetries of construction can compromise the purity of motion demanded for lens adjustment in high-resolution photolithography. Materials used for the different components and their fasteners must be carefully specified to minimize thermal effects due to differences in coefficients of thermal expansion (CTE).

Overall, conventional lens mounting methods are likely to cause overconstraint and other problems affecting purity of motion that limit their usefulness for photolithography applications. While various solutions for axial positioning of optical elements have been proposed, there remains a need for an optical assembly mount that allows adjustment of position for individual optical components along the optical axis, but inhibits rotation and movement along axes other than the optical axis, uses a relatively small number of parts, and provides the level of performance necessary for use with optical assemblies for microlithography and other precision optical and positioning applications. Further, it would be advantageous to provide a solution that is capable of monolithic fabrication.

SUMMARY

It is an object of the present invention to advance the art of lens mounting and adjustment. With this object in mind, the present invention provides a positioning apparatus for providing relative movement between a first member and a second member, the positioning apparatus comprising:

a lever element pivotably coupled to the first member along a fulcrum member and having an actuator arm and a positioner arm;

first and second flexure elements extending between the positioner arm of the lever element and the second member;

and an actuator coupled to the actuator arm of the lever element.

It is a feature of the present invention that it provides a pattern of mechanical constraints between first and second members using strut flexures that extend between first and second members.

It is an advantage of an embodiment of the present invention that it provides an optical mount apparatus that constrains motion in any direction but allows precision adjustment of position along the optical axis.

BRIEF DESCRIPTION OF THE DRAWINGS

FIG. 4 is a perspective bottom view of a positioning apparatus in one embodiment.

DETAILED DESCRIPTION

In the context of the present disclosure, terms "top" and "bottom" are relative and do not necessarily indicate any necessary orientation of a surface, but are used simply to refer to and distinguish opposite surfaces for a component or block of material.

Figures shown and described herein are provided in order to illustrate key principles of operation and fabrication for optical mount devices according to the present invention and are not drawn with intent to show actual size or scale. Some exaggeration may be necessary in order to emphasize basic structural relationships or principles of operation.

It should be noted that the mathematical definition of a cylinder includes not only the familiar right circular cylinder, but also any number of other shapes whose outer surface can be defined by moving a straight line parallel to a fixed straight line, wherein the moving straight line intersects a fixed planar closed curve or base. Although cylindrical shapes are shown for embodiments of the present invention, the supporting elements of a lens mount could be non-cylindrical in shape.

It is known in the field of kinematics that a pattern of six constraints can be used to constrain every degree of freedom (DOF) of a rigid body with respect to a reference body. Apparatus and methods of the present invention provide an adjustable flexure apparatus and a six-constraint arrangement using at least a first, a second, and a third adjustable flexure apparatus that allows an inner element to be rigidly positioned with respect to an outer element, and adjustable to control motion along a single axis over a limited range.

Figure 1:
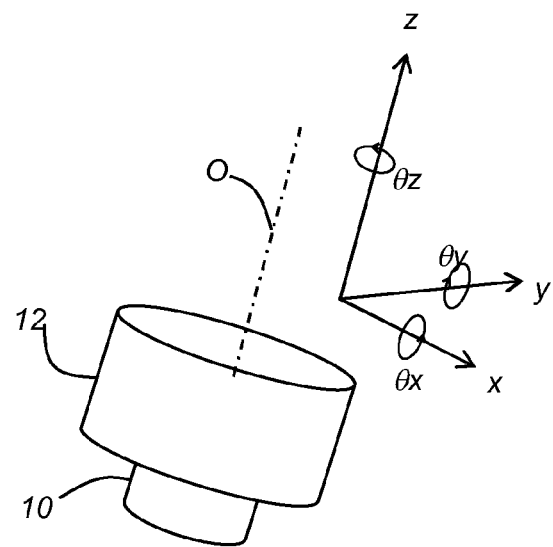
FIG. 1 is a perspective view showing the overall function of an ideal lens mount relative to standard coordinate axes.

Referring to FIG. 1, there is shown an inner member, an optical element holder 10, that lies within an outer member, a frame 12, with reference xyz axes designations. The z axis corresponds to the optical axis O. For a number of applications, such as stepper lens focus described earlier in the background section, only adjustable movement parallel to the z-axis is desirable. For this type of application, the mount mechanism that connects lens holder 10 to frame 12 must allow translational motion only in the direction of optical axis O, that is, only in the z-direction. Translation in the x-y plane or rotation about x, y, or z axes (θx, θy, or θz rotation) must be prevented. Embodiments of the present invention can be used to provide this constraint as well as to provide an adjustable flexure apparatus that can be used to control positioning in a broader range of applications.

Given the axis and positional definitions of FIG. 1, subsequent FIGS. 2A through 5B then show basic principles of operation for embodiments of the present invention for providing adjustable axial positioning of a first inner member relative to a second outer member. FIGS. 2A through 5B present one exemplary embodiment that uses a positioning apparatus for which components are readily visible and operation can be more easily understood. Subsequent FIG. 6 and following then show an example of a monolithic embodiment that is spatially more compact, but uses the same principles and overall components.

Figure 2A:
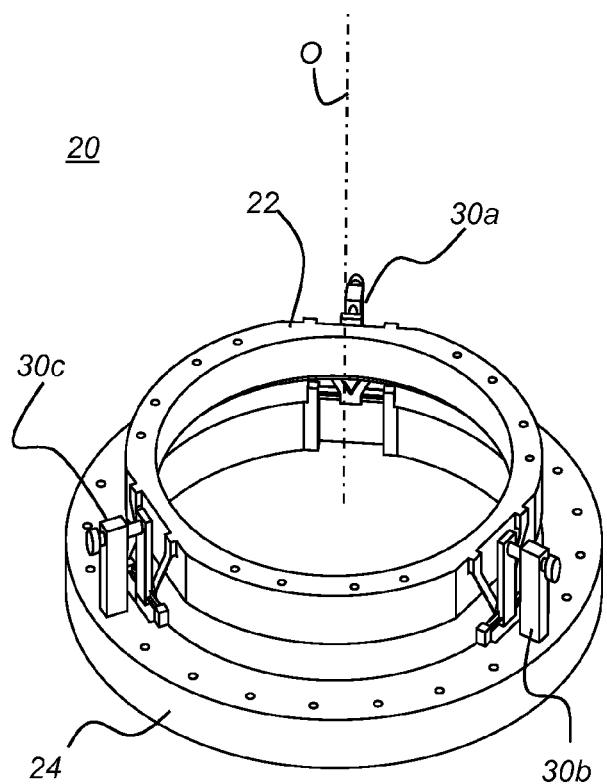
FIG. 2A is a perspective view of an optical element assembly in one embodiment.
Figure 2B:
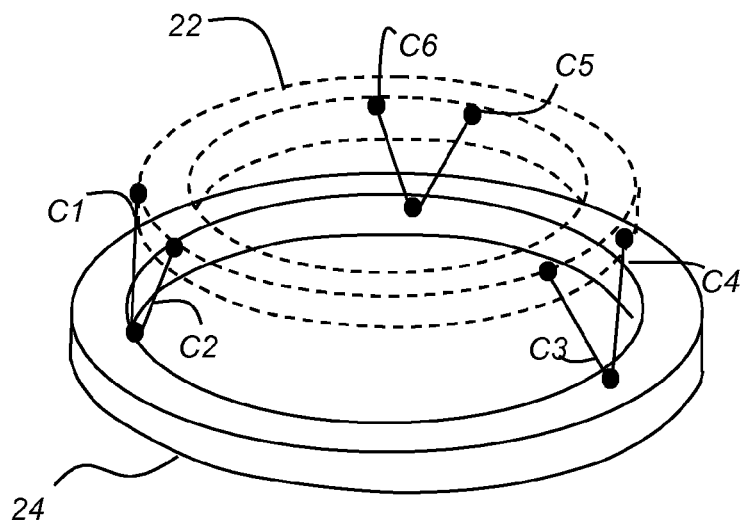
FIG. 2B is a perspective view showing the arrangement of constraints for the embodiments shown in FIG. 2A and elsewhere.

FIG. 2A shows a perspective view of an optical element assembly 20 that allows adjustment of an inner member 22 with respect to an outer member 24 along axis o in one embodiment. This embodiment uses a first positioning apparatus 30a, a second positioning apparatus 30b, and a third positioning apparatus 30c, each having a kinematic arrangement of constraints. The schematic view of FIG. 2B shows, at an exaggerated scale, the pattern of six constraints C1-C6 provided by this arrangement for supporting inner member 22 within outer member 24. These constraints are provided in pairs, constraint C1 paired with constraint C2, C3 with C4, and C5 with C6.

Figure 3:
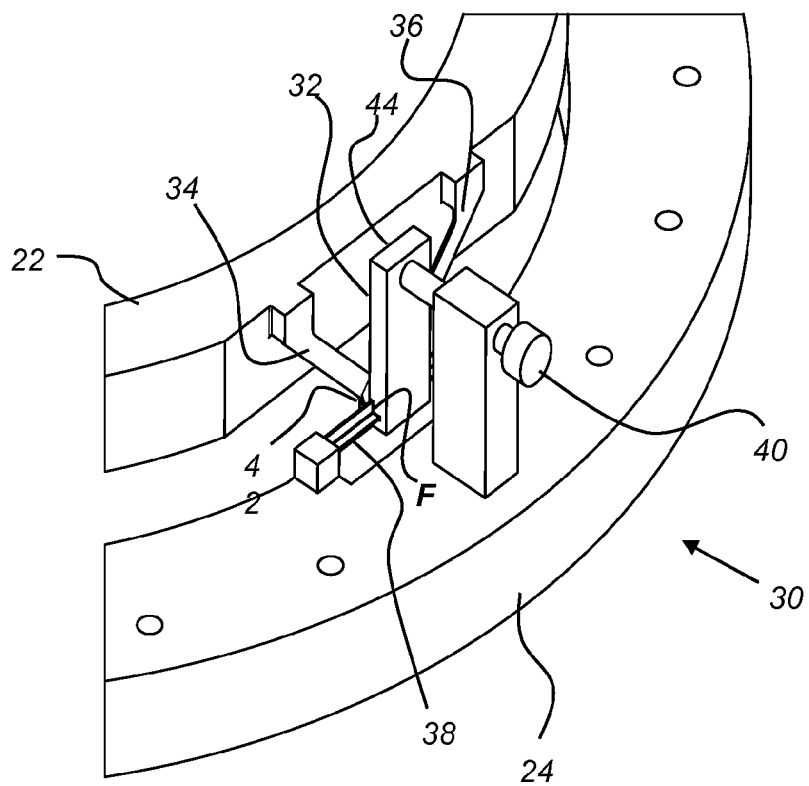
FIG. 3 is a perspective top view of a positioning apparatus in one embodiment.

The perspective view of FIGS. 3 and 4 show, from top and bottom views respectively, the configuration of a single positioning apparatus 30 in one embodiment. A lever element 32 is pivotably coupled to outer member 24 along a fulcrum member 38 which provides a fulcrum F for lever element 32. Lever element 32 has a positioner arm 42 and an actuator arm 44, shown in more detail in subsequent figures. Two flexure elements, strut or bar flexures 34 and 36, extend from positioner arm 42 of lever element 32 to inner member 22. An actuator 40, shown in this embodiment as an adjustment screw, is mechanically coupled to an arm of lever element 32 for causing rotation about fulcrum F. Fulcrum member 38 allows lever element 32 to pivot about the axis of fulcrum F, but inhibits lever element 32 with respect to any other degree of freedom. Depending on materials and geometry, fulcrum member 38 may additionally provide some measure of torsion force for restoring lever element 32 to a resting position.

Figure 5A:
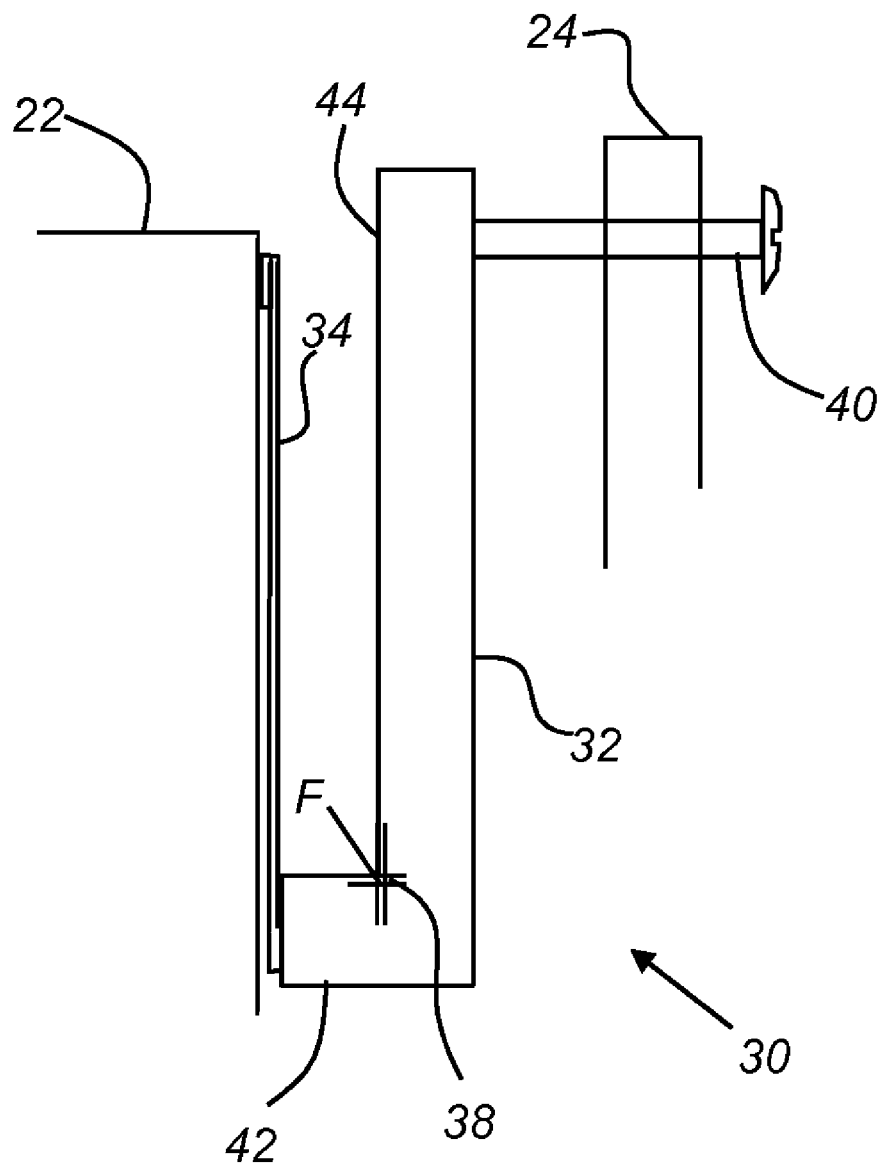
FIGS. 5A and 5B are schematic side views that show how actuation of a lever element can be used to adjust position with respect to a single axis.
Figure 5B:
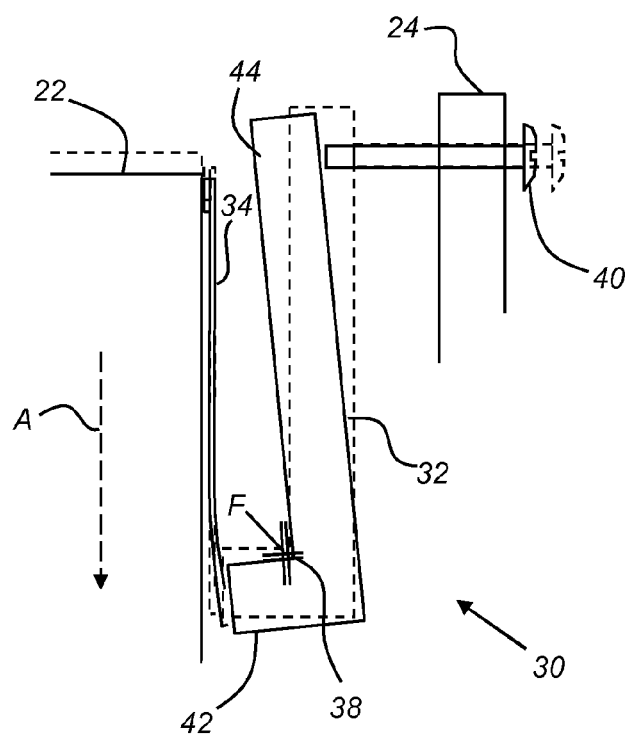

The schematic side views of FIGS. 5A and 5B show an embodiment of lever element 32 with its actuator arm 44 and positioner arm 42 on either side of fulcrum F. The mechanical advantage provided by lever element 32 means that movement of actuator arm 44 over some distance causes a proportionately smaller movement of positioner arm 42. This mechanical advantage allows actuation of lever element 32 to provide precision positioning of inner member 22 with respect to a single axis. Positioner arm 42 is coupled to flexures 34 and 36 (flexure 36 not visible in the side view of FIGS. 5A and 5B). Actuation, as shown in exaggerated form in FIG. 5B, referenced to the original positions of FIG. 5A that are shown in dashed lines, causes incremental movement of lever element 32 about fulcrum F. In the embodiment shown, adjustment of actuator 40 inward, toward actuator arm 44, causes lever element 32 to rotate counter-clockwise about fulcrum F, forcing downward movement of flexures 34 and 36 and movement of inner member 22 along the direction marked by arrow A in FIG. 5B.

When flexures 34 and 36 are suitably thin and flexible, their bending action, as shown in exaggerated form in FIG. 5B, helps to prevent applying force that might otherwise tend to deform inner member 22.

First, second, and third positioning apparatus 30a, 30b, and 30c in the embodiment of FIG. 2A can be fabricated from multiple parts, using conventional fasteners and suitably sized lever, suspension, and flexure components. However, as is familiar to those skilled in the mechanical assembly arts, accumulated tolerance errors can make positioning apparatus 30 difficult to implement at smaller scales with such an assembled embodiment. In addition, where different materials are used for the components of positioning apparatus 30, CTE differences between such materials can cause some difficulty as temperatures vary.

The embodiments shown in FIG. 6 and following utilize the same principles of operation described with reference to FIGS. 2A through 5B, but provide the body of optical element assembly 20 as monolithically constituted in a more compact configuration. When formed from a single piece of material and machined using automated tools and techniques, as described in more detail subsequently, positioning apparatus 30 and optical element assembly 20 can be fabricated to precision tolerances without problems relating to CTE differences, and have various other advantages due to monolithic fabrication. From one aspect of monolithic fabrication, forming optical element assembly 20 can be considered forming a pattern of one or more cavities or channels 46 in a block of material, where channels 46 define inner member 22 within outer member 24. Monolithic fabrication can be subtractive, performed by machining, or additive, performed using deposition, as described in more detail subsequently.

Figure 7:
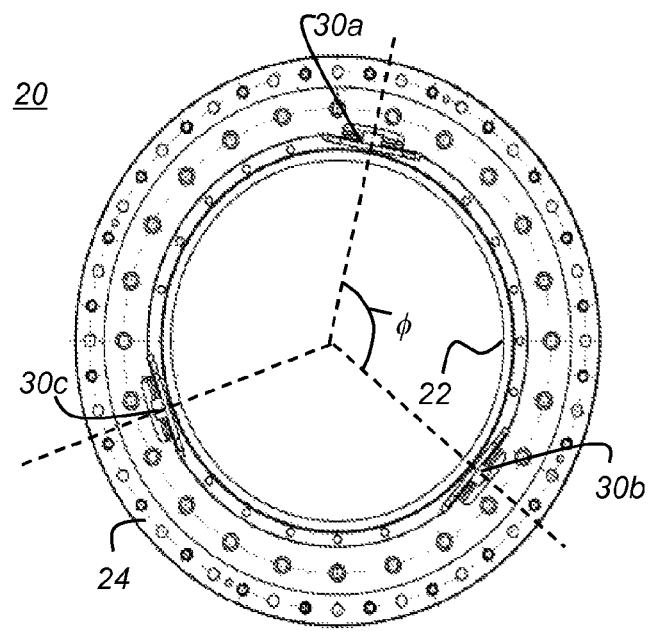
FIG. 7 is a plan view showing angular distribution of multiple positioning apparatus for an optical element assembly embodiment.

The plan view of FIG. 7 shows an arrangement with first, second, and third positioning apparatus 30a, 30b, and 30c in a monolithic embodiment. In both assembled and monolithic embodiments, the equiangular arrangement shown in FIG. 7 is advantaged for providing controlled axial positioning, as can be recognized by those skilled in the mechanical arts. Here, angle φ from the center of one positioning apparatus 30a, 30b, or 30c to the next is 120 degrees.

Figure 8:
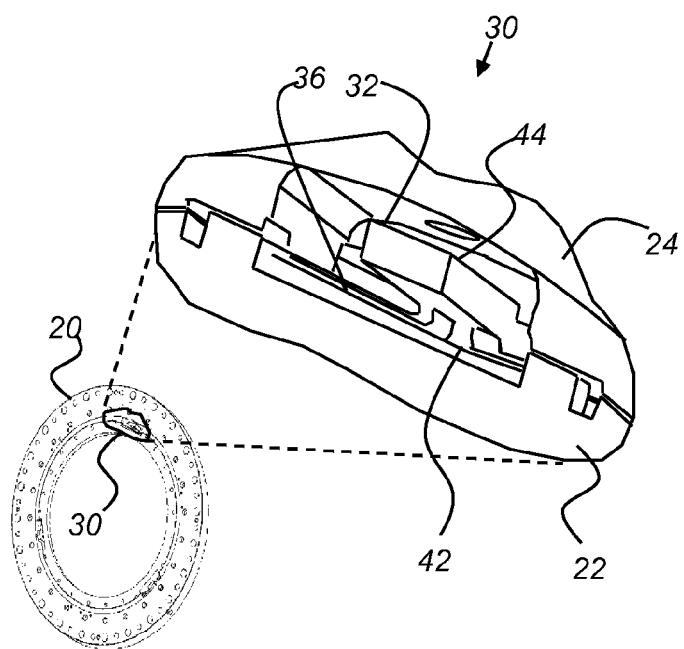
FIG. 8 is a close-up view of a monolithically formed positioning apparatus in perspective, from the top.
Figure 9:
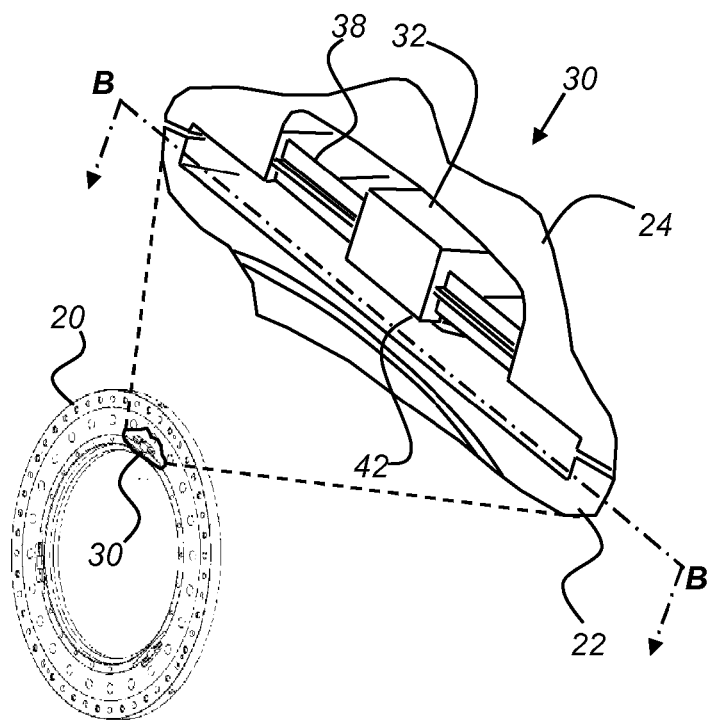
FIG. 9 is a close-up view of the monolithic positioning apparatus in perspective, from the bottom.
Figure 10:
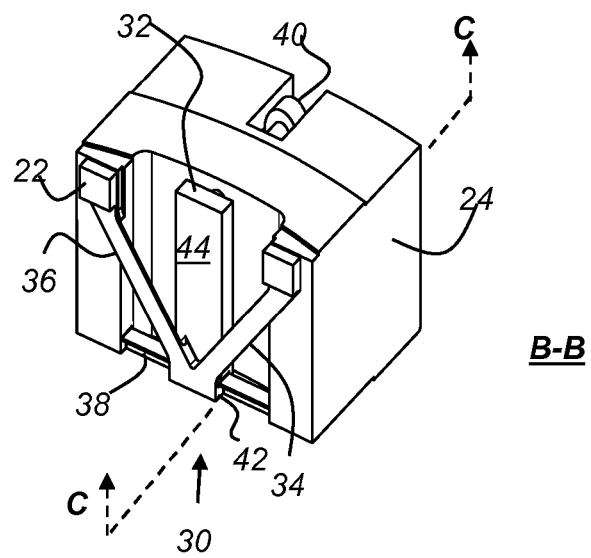
FIG. 10 is a sectioned view showing the positioning apparatus of the present invention in perspective.

The perspective top and bottom views of FIGS. 8 and 9 show, at an enlarged scale, an arrangement of positioning apparatus 30 when monolithically formed. FIG. 10 is a perspective cutaway view taken along line B-B in FIG. 9, with actuator 40. In this embodiment, positioning apparatus 30 is more compactly packaged than in the embodiment shown in FIGS. 2A, 3, and 4, but employs the same basic leverage and flexure components and principles. It should again be observed that top and bottom are considered relative to each other only and do not imply that there is any particular orientation that would be required for positioning apparatus 30 or optical element assembly 20.

Figure 11:
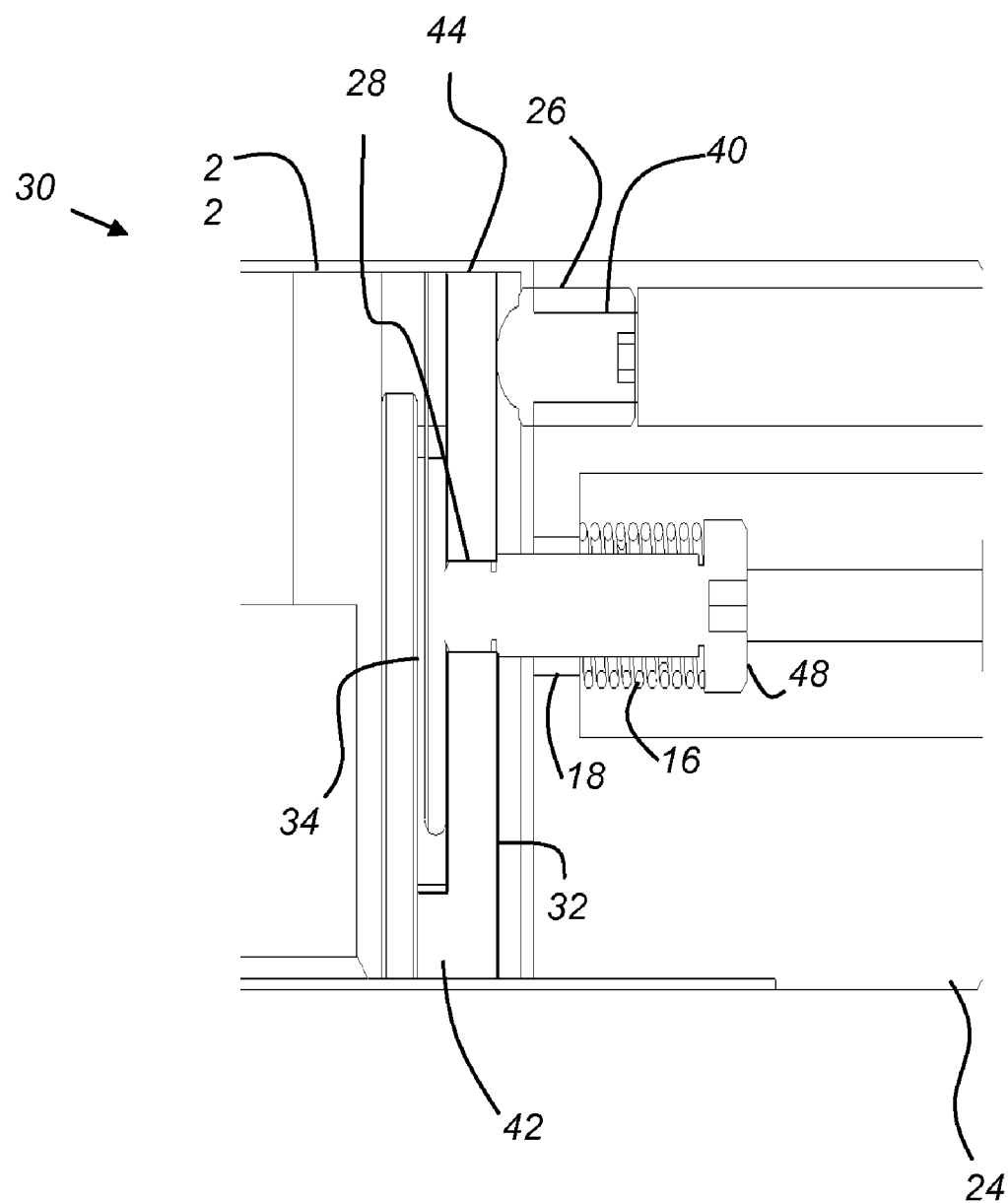
FIG. 11 is a sectioned view showing an alternate embodiment using a loading force.

An optional spring force can be provided for positioning lever element 32 against actuator 40. FIG. 11 shows the right angle cross section C-C, indicated in FIG. 10, taken lengthwise through actuator 40. This view shows an alternate embodiment that has a shoulder screw 48 extending through an access hole 18 in outer member 24 and seated in a tapped hole 28 of lever 32. A compression spring 16 provides a preloading force, pulling back on lever element 32 to assure contact between actuator arm 44 and actuator 40. Actuator 40 is shown here as an adjustment screw, seated in a threaded hole 26.

Fulcrum member 38 is shown having an "L" cross-sectional shape in the monolithic construction of FIGS. 7-10; alternately, a "plus" + or "T" cross-sectional shape could be provided, advantaged for improved mechanical robustness and manufacturability.

The embodiments shown in FIGS. 2A and 6 through 11 can be used for positioning optical elements in any of a number of applications, including microlithography apparatus as described earlier in the background section. The optical element is typically secured within inner member 22 in order to travel along the z axis according to positioning apparatus 30 adjustment. However, it should be noted that an optical element could instead be mounted on or within outer member 24; embodiments of positioning apparatus 30 could be used for either arrangement. In addition to lenses, positioning apparatus 30 could be used for embodiments of optical element assembly 20 that control the position of other devices, including any of a number of types of refractive, reflective, prismatic, polarization retardance, film, modulator, receiver, sensor, light or other signal source, or other optical component. As another option, inner member 22, or outer member 24, could serve as the optical element itself, by being treated with a reflective coating, for example. Shown as cylindrical and symmetric about optical axis 0 in the embodiments described herein, inner and outer members 22 and 24 can have any suitable shape, and symmetry about the optical axis is not required.

Actuator 40 (FIGS. 3, 5A, 5B, 10, and 11), coupled to actuator arm 44, can be any of a number of devices for manual adjustment, including an adjustment screw. As an adjustment screw, actuator 40 can be manually adjusted, to hold a given position until further adjustment is needed. Alternately, actuator 40 can be a device driven electronically, such as using a motor or piezoelectric device, or actuated magnetically, thermally, or using some other source, such as using fluid power or compressed gases, for example. For monolithic embodiments of positioning apparatus 30 or optical element assembly 20, actuator 40 may include one or more separate pieces of added hardware rather than be itself a monolithically constituted structure. For example, a threaded insert may be provided for an adjustment screw, such as was described with reference to FIG. 11.

Monolithic Fabrication

Either subtractive or additive monolithic fabrication techniques could be used. Subtractive techniques form a device by forming an arrangement of cavities or channels in a single block of material. Additive techniques deposit material in a pattern to form a single part, with cavities or channels defining individual components of the device. Single-part construction has advantages for eliminating problems such as those caused by thermal coefficient (CTE) differences and fastener fabrication and assembly, as noted earlier. Overall, a single-part machined lens mount assembly would have reduced mechanical stress over other types of lens mounts. A single part allows simpler handling, assembly, and mounting for constructing an optical assembly. A monolithically formed optical mount also has built-in alignment of its internal components.

Forming an optical element mount from a single block of material by fabricating an inner member suspended within an outer member has configuration advantages and allows flexible design. The outer member can be suitably dimensioned for mounting in an optical assembly while the inner member can be appropriately designed for holding an optical component in position along the optical axis.

Using machining techniques made possible by Computerized Numerical Control (CNC), highly accurate and repeatable machining can be performed to provide single-part construction. EDM machining (Electrical Discharge Machining) is one specialized form of CNC machining that can be used for precision monolithic fabrication of complex parts from metal and other hard, conductive materials. Briefly, EDM selectively erodes material from a workpiece of a conductive substance using an electrical discharge across the gap between an electrode and the material to be removed. A dielectric fluid continually flows in the gap area around the electrode and flushes out the removed material. Wire EDM is one form of EDM, using a continuously moving wire as its electrode. Other techniques that may be suitable for fabricating a monolithic component can include conventional machining, laser machining, various etching techniques, water jets, and machining technologies in general that remove material from a solid block, forming and shaping cavities or channels of defined dimensions, controlling their overall contour and depth.

With some materials, optical element assembly 20 can be a molded part or can be formed by additive methods, including material deposition, for example. Any of a number of rapid prototyping techniques could be used to provide a monolithic structure. Some examples of rapid-prototyping technologies that could be employed for fabrication of optical element assembly 20 include Selective Laser Sintering (SLC), stereolithography, and a host of other techniques that fabricate solid structures in an additive fashion. These techniques deposit a single material in a pattern that forms the inner member of optical element assembly 20 within the outer member.

The material used for monolithic optical element assembly 20 can be any suitable material for the type of application and fabrication method, including stainless steel, aluminum, or some other metal, or any of a number of types of polymers such as plastics, ceramics, or other materials that allow the necessary degree of flexure. For EDM use, a conductive material is required.

Optical element assembly 20 may also have advantages for providing its arrangement of constraints in applications other than photolithography. Because it can be formed as a monolithic structure, the kinematic mount mechanism of the present invention can be precision-fabricated, eliminating a significant amount of assembly and adjustment needed with conventional lens mounting devices.

Figure 6:
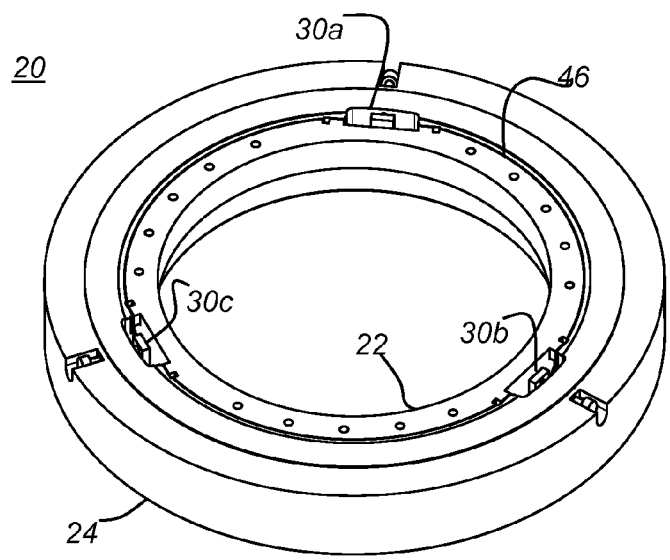
FIG. 6 is a perspective view of a monolithically constituted optical element assembly in one embodiment.

Positioning apparatus 30 is advantaged for allowing control over axial translation as described with respect to the embodiments of optical element assembly 20 in FIGS. 2A and 6. In a more general application, positioning apparatus 30 can be employed in any of a number of configurations where it is desirable to control movement for positioning a first member relative to a second member, whether or not this relative movement is along an axis that is common to both first and second members. For example, positioning apparatus 30 can be provided at one or two locations for controlling relative position between a first and second member. In an optical apparatus or instrument, adjustment of a single positioning apparatus 30 could help to compensate for tilt of an optical or sensing component relative to a signal path, for example.

Positioning apparatus 30 has been shown and described primarily with reference to control of vertical movement. However, it must be noted that there is no required orientation, vertical, horizontal, or otherwise, for positioning apparatus 30 or optical element assembly 20 of the present invention.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while the apparatus of the present invention is well-suited to photolithography applications, this mount can be used in any of a number of other applications for which only adjustable, incremental z-axis motion is permissible.

Thus, what is provided is a kinematic optical mount for an optical element that allows positioning along an optical axis, but constrains rotational movement along any axis and constrains translational movement in directions orthogonal to the optical axis.

The invention claimed is:

1. A positioning apparatus for providing relative movement between a first member and a second member, the positioning apparatus comprising:
    a lever element pivotably coupled to the first member along a fulcrum member and having an actuator arm and a positioner arm;
    first and second flexure elements extending between the positioner arm of the lever element and the second member;
    and
    an actuator coupled to the actuator arm of the lever element.

2. The positioning apparatus of claim 1 wherein the actuator is a screw.

3. The positioning apparatus of claim 1 wherein the actuator is electromechanically energized.

4. The positioning apparatus of claim 1 wherein the first member and second member are monolithically formed.

5. An optical element mount comprising:
    a first member;
    a second member;
    at least a first positioning apparatus, a second positioning apparatus, and a third positioning apparatus, each positioning apparatus disposed to provide relative movement between the first member and the second member, and each positioning apparatus comprising:
    a lever element pivotably coupled to the first member along a fulcrum member and having an actuator arm and a positioner arm;
    first and second flexure elements extending between the positioner arm of the lever element and the second member;
    and
    an actuator coupled to the actuator arm of the lever element.

6. The optical element mount of claim 5 wherein the first member is substantially cylindrical.

7. The optical element mount of claim 5 wherein the second member comprises a lens or prism.

8. The optical element mount of claim 5 wherein the second member comprises a reflective element.

9. The optical element mount of claim 5 wherein the second member comprises an optical receiver, sensor, or source.

10. The optical element mount of claim 5 wherein the second member is substantially symmetric about an axis.

11. The optical element mount of claim 5 formed from a single block of material.

12. A monolithic optical element mount comprising:
    a) a block of material having top and bottom surfaces;
    b) an inner member defined by one or more cavities formed within the block, suspended within an outer member, and movable with respect to the outer member along an axis,
    and
    c) a first positioning apparatus, a second positioning apparatus, and a third positioning apparatus, each positioning apparatus disposed to suspend the inner member within the outer member and to allow relative movement along the axis between the inner member and the outer member, and each positioning apparatus formed to comprise:
    a lever element pivotably coupled to the outer member along a fulcrum member, having a movable actuator arm for pivoting, and having a positioner arm;

first and second flexure elements extending between the positioner arm of the lever element and the inner member.

13. The monolithic optical element mount of claim 12 wherein the block of material is an electrically conductive material.

14. The monolithic optical element mount of claim 12 wherein the material is taken from the group consisting of stainless steel and aluminum.

15. The monolithic optical element mount of claim 12 wherein the inner member is substantially cylindrical.

16. The monolithic optical element mount of claim 12 wherein the inner member has an opening.

17. The monolithic optical element mount of claim 12 wherein the inner member holds an optical element taken from the group consisting of a refractive element, a reflective element, a prism, a sensor, a source, and a film.

18. The monolithic optical element mount of claim 12 wherein the inner member is symmetric about the axis.

19. The monolithic optical element mount of claim 12 wherein one or more of the inner member, outer member, or first, second, or third positioning apparatus is formed by a materials deposition process.

20. The monolithic optical element mount of claim 12 formed using electrical discharge machining.

* * * * *